United States Patent
Hung et al.

(10) Patent No.: US 7,483,302 B2
(45) Date of Patent: Jan. 27, 2009

(54) NON-VOLATILE MEMORY DEVICE AND METHOD OF COMPENSATING LEAKAGE READING CURRENT OF A NON-VOLATILE MEMORY ARRAY

(75) Inventors: Chun-Hsiung Hung, Hsinchu (TW); Su-Chueh Lo, Miaoli County (TW); Han-Sung Chen, Hsinchu (TW)

(73) Assignee: Macronix International Co. Ltd., Hsinchu (TW)

( * ) Notice: Subject to any disclaimer, the term of this patent is extended or adjusted under 35 U.S.C. 154(b) by 0 days.

(21) Appl. No.: 12/068,195

(22) Filed: Feb. 4, 2008

(65) Prior Publication Data

US 2008/0186770 A1   Aug. 7, 2008

Related U.S. Application Data

(63) Continuation of application No. 11/293,239, filed on Dec. 5, 2005, now Pat. No. 7,345,917.

(51) Int. Cl.
  *G11C 11/34* (2006.01)
(52) U.S. Cl. ............................. 365/185.16; 365/185.11
(58) Field of Classification Search ............ 365/185.16, 365/185.11, 185.18
  See application file for complete search history.

(56) References Cited

U.S. PATENT DOCUMENTS

| | | |
|---|---|---|
| 4,267,632 A | 5/1981 | Shappir |
| 5,204,835 A | 4/1993 | Eitan |
| 5,392,233 A | 2/1995 | Iwase |
| 6,272,043 B1 | 8/2001 | Hollmer |
| 6,314,015 B1 | 11/2001 | Morikawa et al. |
| 6,420,237 B1 | 7/2002 | Chang |
| 6,421,267 B1 | 7/2002 | Kuo et al. |
| 6,563,735 B1 * | 5/2003 | Chen et al. ............. 365/185.17 |
| 6,650,568 B2 | 11/2003 | Iijima et al. |
| 6,720,613 B1 | 4/2004 | Chang |
| 6,744,667 B2 | 6/2004 | Yamamoto et al. |
| 6,858,495 B2 | 2/2005 | Lai |
| 7,184,318 B2 * | 2/2007 | Kurata et al. ........... 365/185.28 |
| 2003/0053336 A1 * | 3/2003 | Egawa ................... 365/185.05 |
| 2004/0264264 A1 | 12/2004 | Yaegashi et al. |

* cited by examiner

*Primary Examiner*—Anh Phung
(74) *Attorney, Agent, or Firm*—Finnegan Henderson Farabow Garrett & Dunner LLP

(57) ABSTRACT

A non-volatile memory package includes a non-volatile memory array having a plurality of transistors that are electrically coupled in series, each of the transistors having an input terminal and an output terminal such that the output terminal of one of the transistors is coupled to the input terminal of a next transistor in a downstream direction. A read voltage supply supplies a voltage to the input terminal of a selected transistor of the plurality of transistors, to induce a cell current between the input terminal and the output terminal of the selected transistor. A bit sensor receives and evaluates a read current from the output terminal of the selected transistor. A shielding voltage applicator applies a voltage to the input terminal or the output terminal of a downstream transistor of the plurality of transistors, the downstream transistor being in the downstream direction from the selected transistor.

21 Claims, 11 Drawing Sheets

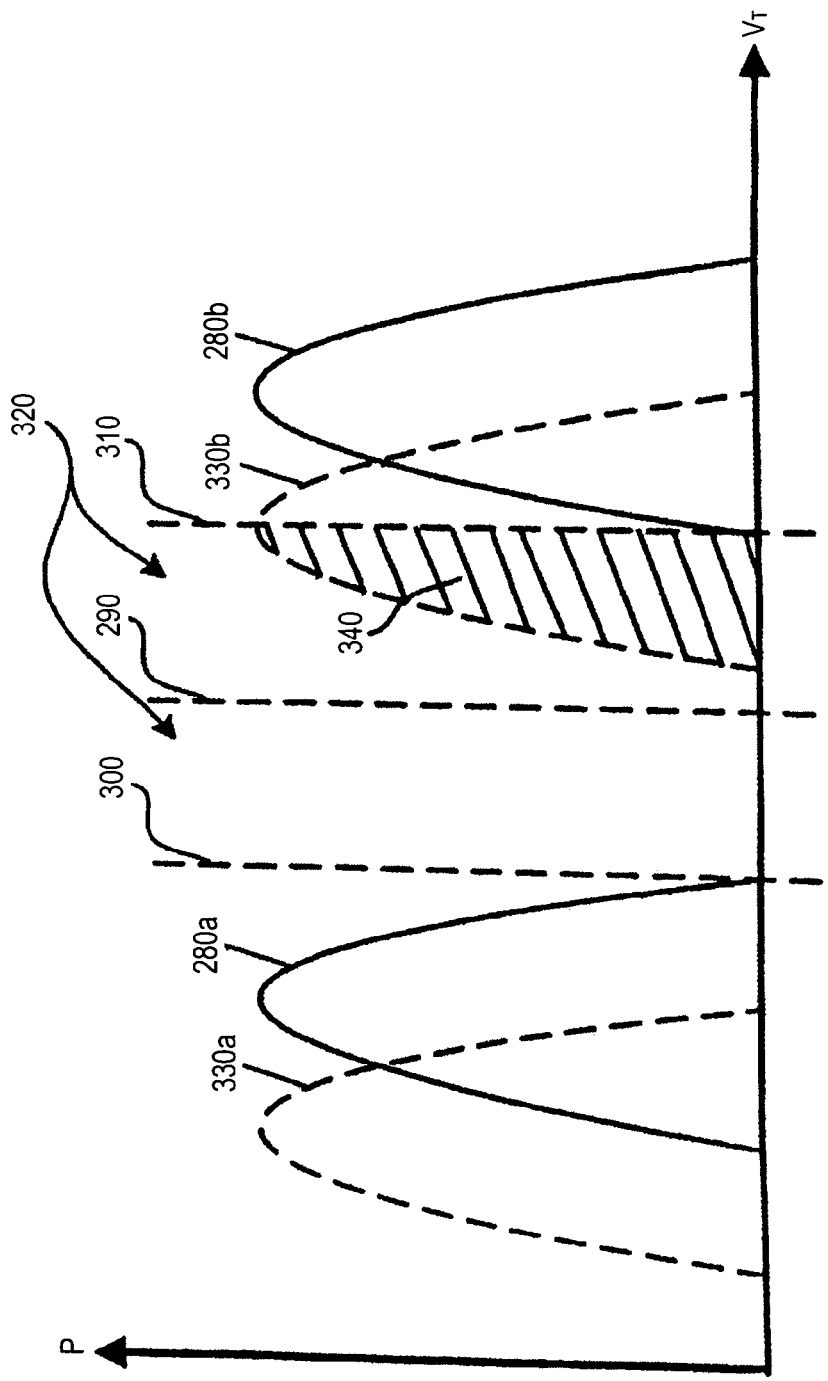

NON-VOLATILE MEMORY DEVICE AND METHOD OF COMPENSATING LEAKAGE READING CURRENT OF A NON-VOLATILE MEMORY ARRAY

RELATED APPLICATION

This is a continuation of application Ser. No. 11/293,239, filed Dec. 5, 2005, now U.S. Pat. No. 7,345,917,issued on Mar. 18, 2008, the contents of which are incorporated herein by reference in their entirety.

TECHNICAL FIELD

This invention generally relates to reading stored data from a non-volatile memory array.

BACKGROUND

Non-volatile memory (NVM) arrays are used to store data as a plurality of bit states, in a medium that maintains the data without the need for a continuous supply of electrical power. FIG. 1 is a schematic diagram of one embodiment of a conventional NVM array 10 having a plurality of memory cells provided as a plurality of n-channel metal-oxide-semiconductor (NMOS) transistors 20a-20g. Each of transistors 20a-20g has a control gate, a drain, and a source. The NVM array 10 is configured as a "virtual ground array," in which the drain of each one of transistors 20a-20f is directly coupled to the source of the next transistor 20b-20g, respectively, forming a chain of transistors 20a-20g that eliminates the need for an area-consuming ground contact for the source of each of the transistors 20a-20g. For each stored bit state of each of transistors 20a-20g, a predetermined amount of electric charge is programmed in a memory layer of the transistor, such as a floating gate or charge trapping layer of the transistor. This electric charge creates an electric field that alters an effective threshold voltage $V_T$ of the transistor that depends on the bit state of the transistor.

With reference to FIG. 1, a bit state of a selected transistor 20b is evaluated by a bit sensor 30 and a voltage supply 40 that together apply a voltage between the drain and the source of the selected transistor 20b. A current $I_{CELL}$, whose direction is indicated by the hollow arrow 50, is induced through the selected transistor 20b and has a magnitude that is a function of the effective threshold voltage $V_T$ of the selected transistor 20b. The bit sensor 30 comprises a comparator (not shown) that compares the selected transistor's effective threshold voltage $V_T$ to a reference voltage to evaluate the bit state of the selected transistor 20b.

However, when measuring the current between the drain and source of the selected transistor 20b, a portion of current $I_{CELL}$ leaks as a current $I_L$ into the neighboring transistors 20c-20g. As a result, the bit sensor 30 measures a current $I_{READ}$ that is reduced by the leakage current $I_L$, rather than the full drain-to-source current $I_{CELL}$ of the selected transistor 20b, potentially resulting in an incorrect evaluation of the bit state of the selected transistor 20b. Moreover, the leakage current $I_L$ may vary, depending on, for example, the location of the selected transistor 20b or the effective threshold voltage of one of the downstream transistors 20c-20g within the NVM array 15.

Thus, it is desirable to accurately read stored data from cells of a non-volatile memory array. It is further desirable to have a non-volatile memory package including a non-volatile memory array from which programmed data can be accurately read.

SUMMARY

A non-volatile memory package contains a non-volatile memory array comprising a plurality of transistors that are electrically coupled in series, each of the transistors having an input terminal and an output terminal such that the output terminal of one of the transistors is coupled to the input terminal of a next transistor in a downstream direction. A read voltage supply is provided to supply a voltage to the input terminal of a selected transistor of the plurality of transistors, to induce a cell current between the input terminal and the output terminal of the selected transistor. A bit sensor is provided to receive a read current from the output terminal of the selected transistor and evaluate the read current. A shielding voltage applicator is adapted to apply a voltage to the input terminal or the output terminal of a downstream transistor of the plurality of transistors, the downstream transistor being in the downstream direction from the selected transistor.

A method of reading stored data from the non-volatile memory array comprises supplying a read voltage to the input terminal of a selected transistor of the plurality of transistors, to induce a cell current between the input terminal and the output terminal of the selected transistor. A read current is received from the output terminal of the selected transistor, and the read current is evaluated. A voltage is applied to the input terminal or the output terminal of a downstream transistor of the plurality of transistors, the downstream transistor being in the downstream direction from the selected transistor.

BRIEF DESCRIPTION OF THE DRAWINGS

The accompanying drawings, which are incorporated in and constitute a part of this specification, illustrate embodiments of the invention and, together with the description, serve to explain advantages and principles of the invention.

In the drawings,

FIG. 6b is a graph showing the population distributions of FIG. 6a and corresponding shifted population distributions;

DESCRIPTION OF THE EMBODIMENTS

Reference will now be made in detail to embodiments of the invention, examples of which are illustrated in the accompanying drawings. Wherever possible, the same reference numbers will be used throughout the drawings to refer to the same or like parts.

Figure 1:
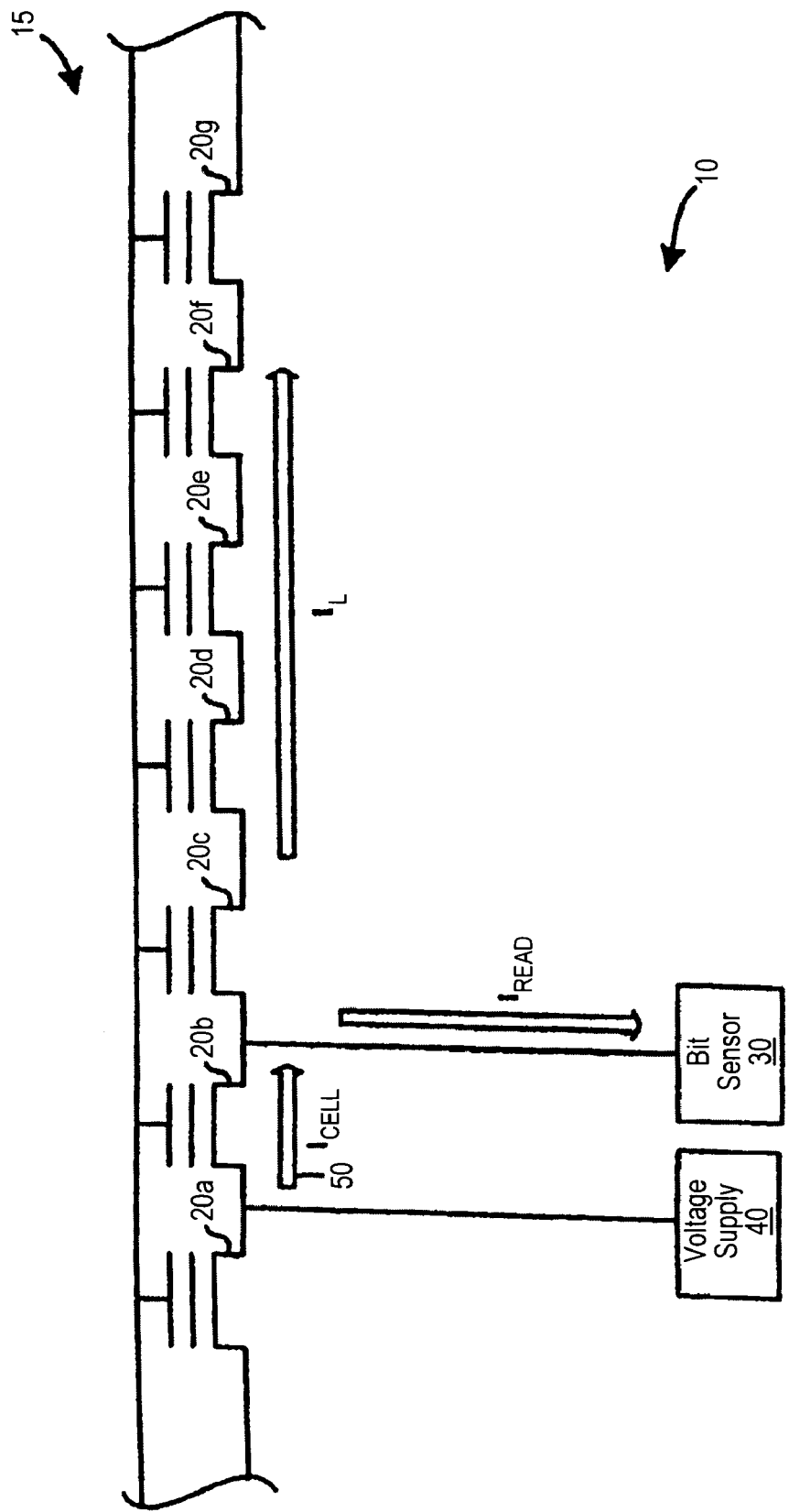
FIG. 1 is a schematic diagram of a conventional non-volatile memory package having a non-volatile memory array that is configured as a virtual ground array.
Figure 2:
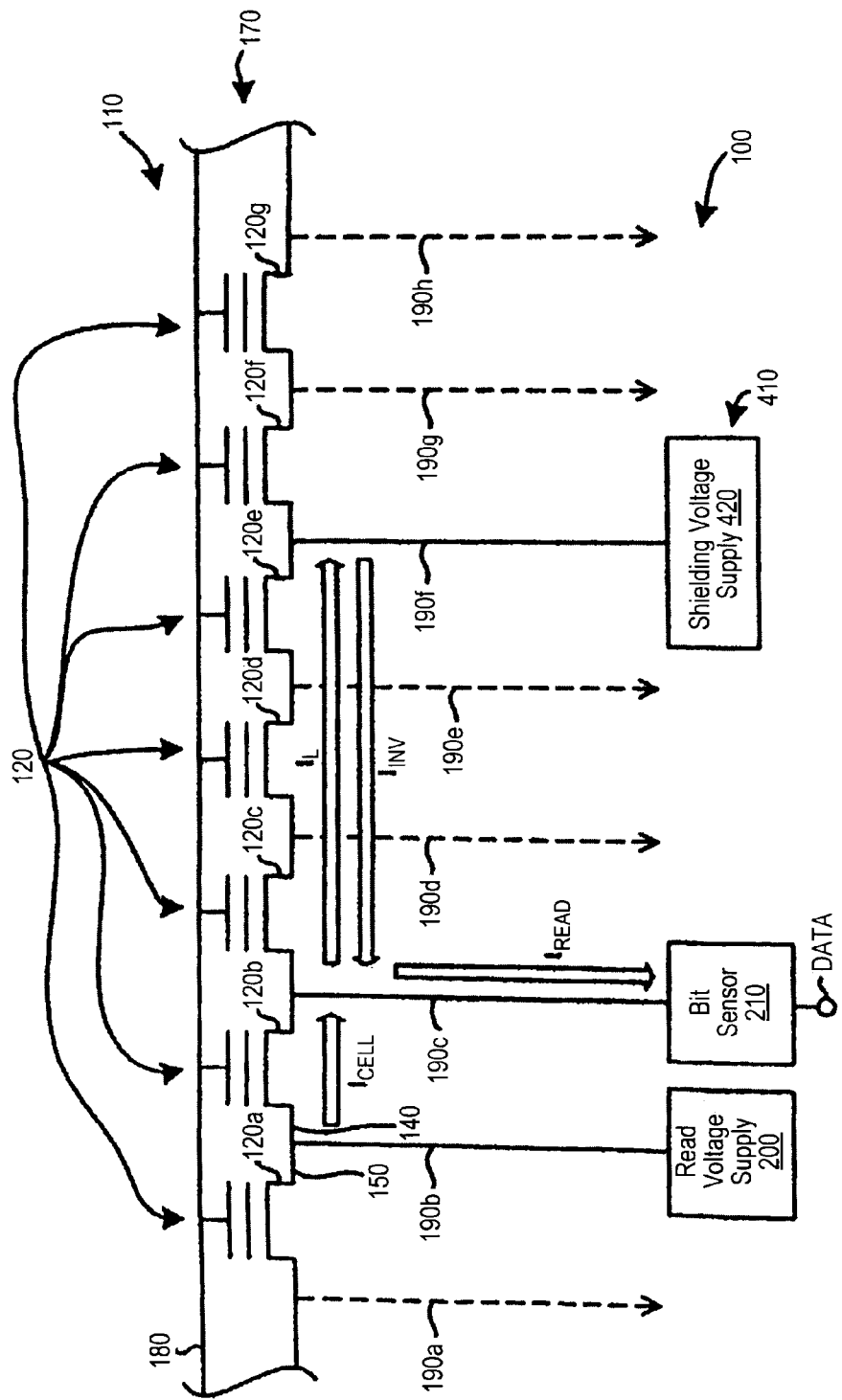
FIG. 2 is a schematic diagram of a non-volatile memory package having a non-volatile memory array that is configured as a virtual ground array coupled to a shielding voltage applicator.

A non-volatile memory package is an integrated circuit (IC) package that comprises a non-volatile memory array. For example, the NVM package may be formed as a thin small-outline package (TSOP) or a chip scale package (CSP) containing the NVM array. The NVM array comprises a plurality of storage cells that are configured as an array to store data. FIG. 2 is a schematic diagram of an exemplary embodiment of an NVM package 100 comprising an NVM array 110, consistent with the present invention. The NVM array 110 of FIG. 2 is provided only to illustrate the invention, and should not be used to limit the scope of the invention or its equivalents to the exemplary embodiments provided herein.

The data storage cells of the NVM array 110 may comprise electrically programmable read-only memory (EPROM) or electrically-erasable programmable read-only memory (EE-PROM). For example, the EEPROM may be "Flash" EEPROM capable of being programmed or erased at multiple cells simultaneously. Alternatively, the EEPROM may be standard EEPROM that is typically adapted for a single cell to be programmed or erased at a time.

Figure 3:
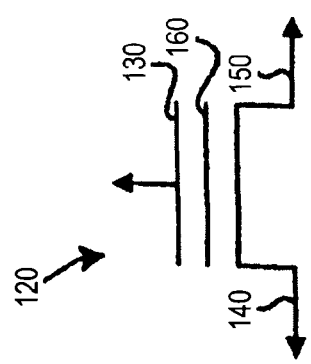
FIG. 3 is a schematic diagram of one of the transistors in the non-volatile memory array of FIG. 2.

As illustrated in FIG. 2, the storage cells of the NVM array 110 are transistors 120. As illustrated in the schematic diagram of FIG. 3, the individual transistors 120 comprise a control gate 130, an input terminal 140, an output terminal 150, and a memory element 160. The control gate 130 regulates the amount of current passing between the input terminal 140 and the output terminal 150. The input terminal 140 is adapted receive electrical current, and the output terminal 150 is adapted to output electrical current. The input terminal 140 and the output terminal 150 are a drain and a source, or alternatively a source and a drain, respectively, of the transistor 120. For example, if the transistor 120 is an n-channel metal-oxide-semiconductor field effect transistor (NMOS FET), the input terminal 140 is the drain of the NMOS FET and the output terminal 150 is the source of the NMOS FET. Alternatively, if the transistor 120 is a p-channel metal-oxide-semiconductor FET (PMOS FET), the input terminal 140 is the source of the PMOS FET and the output terminal 150 is the drain of the PMOS FET.

The memory element 160 of the transistor 120 comprises a material that is adapted to maintain a level of electric charge on at least one bit site of the material without a need for application of power to the transistor 120. The charge level at the bit site corresponds to a bit state of data stored on that bit site of the transistor 120. The electric charge produces an electric field between the input terminal 140 and the output terminal 150 to alter an effective threshold voltage $V_T$ of the transistor 120, and thereby regulate an amount of current able to pass therebetween as a function of the bit state stored on the transistor 120.

The individual transistor 120 may be adapted to store two alternative charge levels at the bit site. However, in another version, the transistor 120 is adapted to store more than two alternative charge levels per bit site, such a transistor being referred to as a "multi-level" cell.

The transistor 120 may, alternatively or in addition, be adapted to contain a plurality of bit sites, which is referred to as a "multi-bit" cell, by storing independently controllable charge levels at a plurality of separate locations of the memory element 160 of the transistor 120. For example, the NVM array 110 may comprise an Nbit™ flash memory array, commercially available from Macronix International Co., Ltd., Hsinchu, Taiwan.

In one embodiment, the transistor 120 is adapted to store more than two levels per bit site in each of a plurality of bit sites, which is referred to as a "multi-level multi-bit" cell. For example, an individual two-level two-bit transistor is adapted to effectively store four binary bits of data by storing data at two bit sites, each of the two bit sites charged to a value selected from four possible charge levels.

In one version, the individual transistor 120 is a charge trapping cell in which the memory element 160 comprises a charge trapping layer (not shown) that is adapted to maintain at least two alternative levels of electric charge thereon. The charge trapping layer typically comprises a dielectric material that is capable of acquiring and holding an electrostatic charge. For example, the charge trapping layer of the individual transistors may be a nitride layer that abuts at least one oxide layer, such as in a metal-nitride-oxide-silicon (MNOS), silicon-nitride-oxide-semiconductor (SNOS), or silicon-oxide-nitride-oxide semiconductor (SONOS) transistor.

In another version, the transistors 120 are floating gate cells. The individual transistor comprises a "floating" gate (not shown) that is embedded and insulated within the transistor. This floating gate is adapted to maintain at least two alternative levels of electric charge thereon. Typically, the floating gate comprises a conductor material. Two exemplary embodiments of the floating gate cells comprise floating gate thin oxide (FLOTOX) transistors and stacked gate injection MOS (SIMOS) transistors.

As illustrated in FIG. 2, the transistors 120 of the NVM array 110 are arranged into rows 170. FIG. 2 is a schematic diagram showing a cut-off section of a single row 170, the cut-off section comprising seven transistors 120. The transistors 120 in the row 170 are electrically coupled in series along the input and output terminals 140, 150 to form a "virtual ground array" (VGA). A direction of current along the row 170 from the input terminal 140 of one of the transistors 120 to the output terminal 150 of that transistor 120 is referred to as "downstream," whereas the opposite direction is referred to as "upstream." The output terminal 150 of a first transistor 120a in the row 170 is connected to the input terminal 140 of a second transistor 120b that is downstream of, and adjacent to, the first transistor 120a in the row 170, forming a chain of serially coupled transistors 120 along the row 170. The respective gates 130 of the transistors 120 in the row 170 are commonly coupled to a "wordline" 180, permitting a voltage to be commonly applied to the gates 130 of the transistors 120a-120g of that row 170 via the wordline 180.

In one version, the input terminal 140 of the individual transistor 120 is coupled to one of "bitlines" 190a-190g, and the output terminal 150 of the transistor 120 is coupled to another one of bitlines 190b-190h, permitting voltages to be applied to the input terminals 140 and the output terminals 150 of the transistors 120 by the bitlines 190a-190h. For example, the transistors 120 of the NVM array 110 may comprise "NOR"-type Flash EEPROM cells that are configured as a VGA, as shown in FIG. 2. Furthermore, a plurality of the transistors 120 in different rows 170 may be configured into columns (not shown), such that at least one of the bitlines 190a-190h is coupled to the input terminal or the output terminal 150 of all of the transistors 120 in the column. For example, the output terminal 150 of the transistor 120 in a first column and the input terminal 140 of the transistor 120 in a second column that is downstream of, and adjacent to, the first column may be coupled to the same bitline 190a-190h, as shown in FIG. 2. For example, the output terminal 150 of the transistor 120a and the input terminal 140 of the transistor 120b are both coupled to the same bitline 190b.

In one version, the transistors 120 are manufactured as complementary metal-oxide-semiconductor (CMOS) transistors sharing a semiconductor substrate (not shown). The input terminals 140 and the output terminals 150 comprise doped diffusion regions in the semiconductor substrate. If the NVM array 110 of these transistors 120 comprises a VGA, as shown in the example of FIG. 2, each bitline 190a-190h may be a doped diffusion region that is shared by the output terminal 150 of a first transistor and the input terminal 140 of a second transistor that is downstream of, and adjacent to, the first transistor. For example, the output terminal 150 of the transistor 120a can share a single doped diffusion region with the input terminal 140 of the transistor 120b. Furthermore, if the transistors 120 are configured into columns sharing at least one of bitlines 190a-190h, the doped diffusion regions that form the input terminals 140 and the output terminals 150 may themselves form the shared bitlines 190a-190h that serve as electrical terminals by which voltages or currents can be applied to the transistors 120. In this case, the doped diffusion regions that constitute the shared bitlines 190a-190h extend along the semiconductor substrate, through the transistors 120 of the column.

At least one of the rows 170 or the columns may comprise transistors 120 that are substantially spatially aligned in the NVM array 110. For example, the transistors 120 of the rows 170 may be arranged substantially orthogonally to the columns to form a substantially rectilinear grid of the transistors 120. This arrangement can permit a spatially compact two-dimensional layout of the NVM array 110. Alternatively, at least one of the rows 170 or the columns may be arranged in a substantially non-linear fashion in two or three dimensions. The rows 170 or the columns of the transistors 120 are not necessarily arranged in straight lines.

Program and read operations can be performed on an EPROM or EEPROM transistor, and erase operations can also be performed on an EEPROM transistor. For example, the transistor 120 is adapted to be programmed to store a preselected bit state on the memory element 160 when a first set of predetermined voltages are applied to the control gate 130, the input terminal 140, and the output terminal 150. The programmed bit state can be erased to cause another stored bit state when a second set of predetermined voltages are applied to the control gate 130, the input terminal 140, and the output terminal 150. The stored bit state can be read when a current is passed from the input terminal 140 to the output terminal 150, the magnitude of that current corresponding to the charge state, when a third set of predetermined voltages are applied to the control gate 130, the input terminal 140, and the output terminal 150.

For example, to perform a program operation on one of the transistors 120, a predetermined voltage of from about 6 to about 12 V, such as about 10.5 V, may be supplied to the control gate 130 by the wordline 180. Meanwhile, a predetermined positive voltage is supplied to the input terminal 140 by the one of bit lines 190a-190g coupled to that input terminal 140. For example, the input terminal 140 may be held at a predetermined voltage of from about 3 to about 7 V. The output terminal 150 is coupled to electrical ground via another one of the bitlines 190b-190h to induce a current between the input terminal 140 and the output terminal 150. The induced current causes electrons to pass into the memory element 160 to program the transistor 120, such as by hot-electron injection or quantum mechanical tunneling, depending on the type of the individual transistor 120.

FIG. 2 illustrates an exemplary configuration for performing a read operation on a selected transistor 120b. To perform the read operation, the control gate 130 of the selected transistor 120b is electrically coupled to a gate voltage supply (not shown) by the wordline 180, the input terminal 140 of the selected transistor 120b is electrically coupled to a read voltage supply 200, such as by the bitline 190b coupled to that input terminal 140, and the output terminal 150 of the selected transistor 120b is electrically coupled to a bit sensor 210, such as by the bitline 190c coupled to that output terminal 150. The read voltage supply 200 is adapted to supply a predetermined read voltage to the input terminal 140 of the selected transistor 120b to induce a downstream cell current $I_{CELL}$ between the input terminal 140 and the output terminal 150 of the selected transistor 120b. For example, the read voltage supply 200 may be adapted to generate a predetermined read voltage at the input terminal 140 of from about 0.8 to about 2.5 V, such as about 1.8 V. These exemplary read voltages may be particularly suited for a selected transistor 120b that is an NMOS FET. Meanwhile, the bit sensor 210 couples the output terminal 150 to a predetermined voltage that is less than the read voltage, such as electrical ground. The gate voltage supply may be adapted to supply a predetermined gate voltage to the control gate 130 of the selected transistor 120b of from about 2 to about 6 V. The magnitude of the induced cell current $I_{CELL}$ is representative of the bit state of the selected transistor 120b.

The bit sensor 210 is coupled to the output terminal 150 of the selected transistor 120b to receive and evaluate a read current $I_{READ}$ from that output terminal 150, to determine the bit state of the selected transistor 120b. The bit sensor 210 is coupled to the output terminal 150 of the selected transistor 120b via the corresponding bitline 190c. The bit sensor 210 may evaluate the read current $I_{READ}$ by comparing the read current $I_{READ}$ to a reference current $I_{ref}$.

Figure 4:
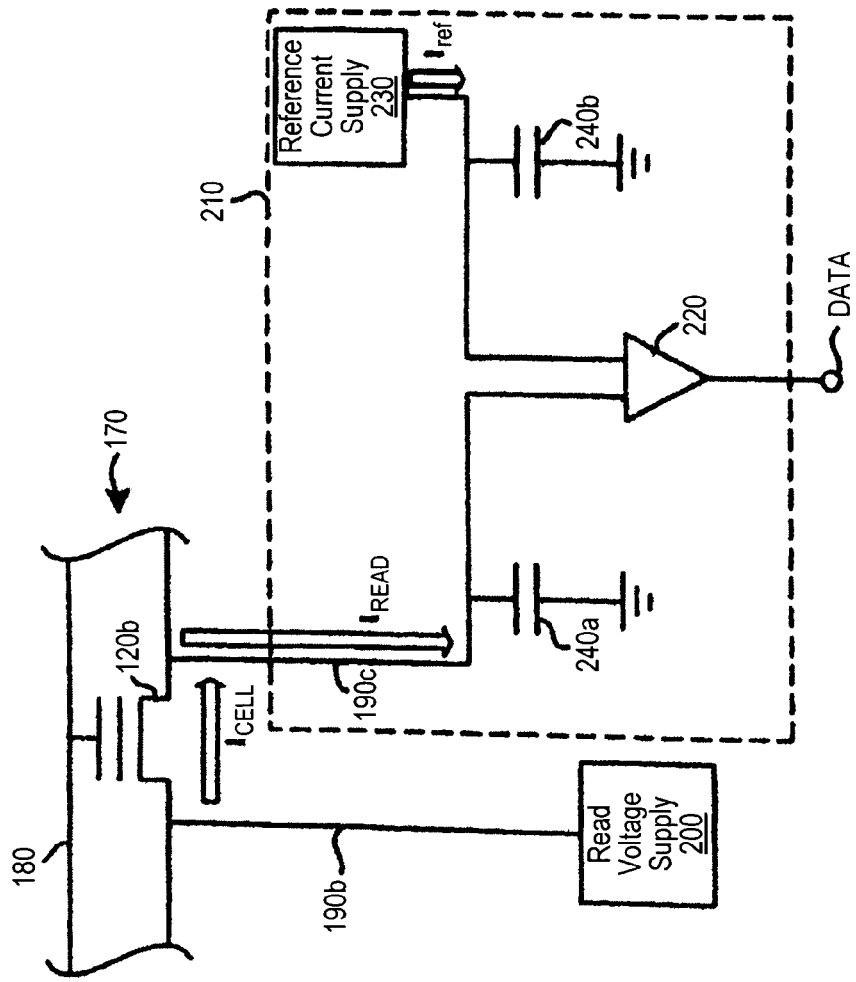
FIG. 4 is a schematic diagram of an expanded section of the non-volatile memory package of FIG. 2, showing an embodiment of a bit sensor in more detail.

FIG. 4 is a schematic diagram of an expanded section of the non-volatile memory package of FIG. 2, showing an exemplary embodiment of the bit sensor 210 in further detail. The bit sensor 210 comprises a reference current supply 230 that is adapted to supply the reference current $I_{ref}$. First and second current-to-voltage converters are respectively provided to convert the read current $I_{READ}$ to a corresponding sense voltage, and the reference current $I_{ref}$ to a corresponding comparator reference voltage $V_{Cref}$. For example, the first and second current-to-voltage converters may comprise first and second capacitors 240a,b, respectively. The bit sensor 210 is adapted to pass the current from the output terminal 150 (shown in FIG. 3) of the selected transistor 120b to the first capacitor 240a to charge the first capacitor 240a to an increasing sense voltage over a preselected time period. For example, the magnitude of the sense voltage may be approximately proportional to the magnitude of the read current $I_{READ}$, as a function of time. After the preselected time period has elapsed, the sense voltage on the first capacitor 240a is evaluated to determine the bit state of the selected transistor 120b. The bit sensor 210 further comprises a comparator 220 adapted to evaluate the sense voltage by comparing the sense voltage to the comparator reference voltage $V_{Cref}$ and generate an output voltage that has a first value if the sense voltage is sufficiently greater than the comparator reference voltage $V_{Cref}$, and a second value if the sense voltage is sufficiently less than the comparator reference voltage $V_{Cref}$. Thus, the comparator 220 outputs a voltage having a value, such as high or low, that corresponds to the data stored on the selected transistor 120b.

Figure 5:
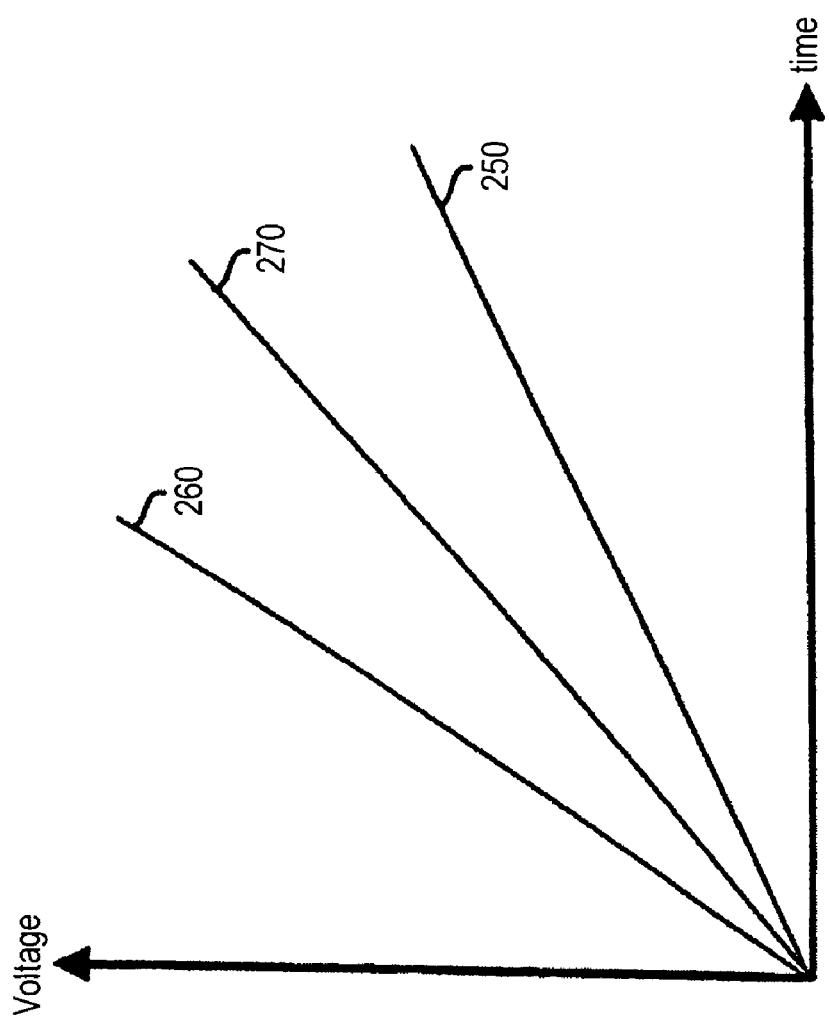
FIG. 5 is a graph showing plots, as a function of time, of a comparator threshold voltage and of sense voltages for transistors that are equal to a low comparator threshold voltage and a high comparator threshold voltage.

FIG. 5 is a graph showing plots, as a function of time, of examples of sense voltages that are equal to a high comparator threshold voltage $V_{CTL}$ 260 and a low comparator threshold voltage $V_{CTH}$ 250 corresponding to the increase over time in the voltage on the first capacitor 240a due to charging by current $I_{READ}$. The comparator reference voltage $V_{Cref}$ is shown as a voltage 270 corresponding to the increase over time in the voltage on the second capacitor 240b due to charging by the current $I_{ref}$. These plots correspond to an exemplary embodiment of the NVM package 100 in which the transistors 120 comprise NMOS FETs, such as NMOS-based Flash memory cells. As described above, the comparator reference voltage $V_{Cref}$ 270 is used to evaluate the sense voltage on the first capacitor 240a in an exemplary read operation. Prior to reading, the second capacitor 240b and the bitlines 190b, 190c coupled to the selected transistor 120b are discharged to ground. Once the read operation begins, the current $I_{ref}$ from the reference current supply 230 begins to charge the second capacitor 240b to the comparator reference voltage $V_{Cref}$ 270. Meanwhile, the read voltage is applied to the bitline 190b. The current $I_{READ}$ from the output terminal 150 of the selected transistor 120b charges the first capacitor 240a to the sense voltage. As a result, the sense voltage on the first capacitor 240a starts at a low value, such as about 0V, and increases monotonically as the read current $I_{READ}$ passes from the output terminal 150 of the selected transistor 120b to the first capacitor 240a to charge the first capacitor 240a. For example, the sense voltage on the first capacitor 240a may increase approximately linearly as a function of time. After a preselected amount of time has elapsed, the comparator 220 compares the sense voltage to the comparator reference voltage $V_{Cref}$ 270 to evaluate the bit state of the selected transistor 120b.

The sense voltage resulting from the selected transistor 120b is preselected to fall inside one of a plurality of voltage ranges that individually correspond to the possible bit states of the transistor 120b. In the present embodiment, it is assumed that each of the transistors 120 will have a relatively low or high effective threshold voltage $V_T$ depending on whether the transistor 120 stores a logic "1" or "0", respectively. The magnitude of $I_{CELL}$ and, correspondingly, $I_{READ}$, will be relatively high or low depending on whether the effective threshold voltage $V_T$ of the transistor 120 being read is low or high, respectively. As a result, the voltage to which the first capacitor 240a charges will be above the high comparator threshold voltage 260, or below the low comparator threshold voltage 250, depending on whether the transistor 120 stores a logic "1" or "0", respectively.

Returning to FIG. 2, the bit sensor 210 is coupled to the output terminal 150 of the selected transistor 120b to evaluate the cell current $I_{CELL}$ passing between the input terminal 140 and the output terminal 150. However, as discussed above, a portion $I_L$ of the cell current $I_{CELL}$ can leak into the transistors 120c-g that are downstream of the selected transistor 120b.

The leakage current $I_L$ results in the bit sensor 210 evaluating a read current $I_{READ}$ that does not fully represent the cell current $I_{CELL}$. The read current $I_{READ}$ can be approximated by Equation 1, as follows:

$$I_{READ} = I_{CELL} - I_L \quad (1)$$

Figure 6A:
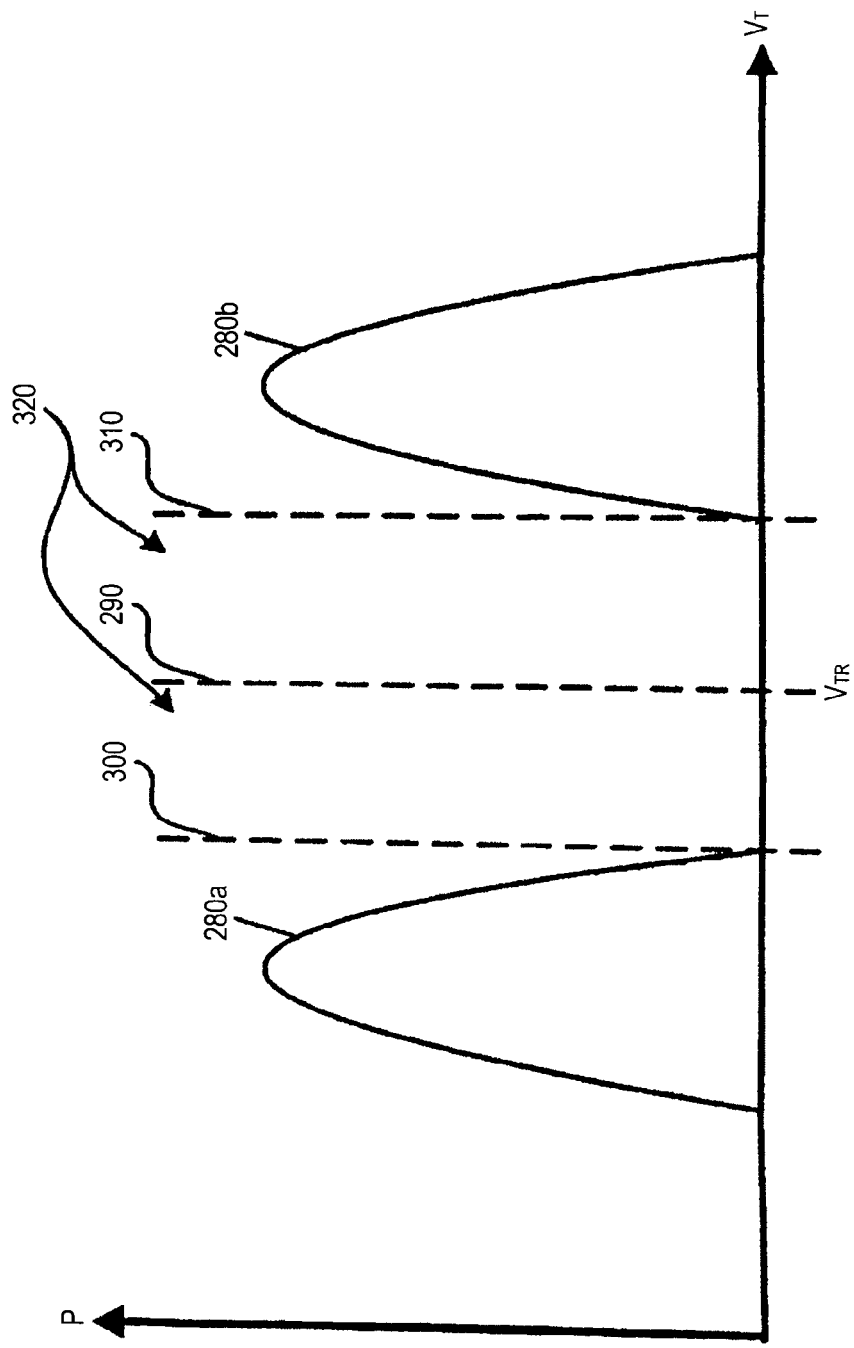
FIG. 6a is a graph showing a plot of distributions of population (P) for the transistors of FIG. 2 as a function of effective threshold voltage ($V_T$)

FIG. 6a is a graph showing a plot of exemplary distributions 280a,b of population (P) of the transistors 120 as a function of the effective threshold voltage ($V_T$) after the transistors 120 have been programmed evenly among the multiple possible bit states. The population of the transistors 120 is distributed across multiple domains of the effective threshold voltage $V_T$, each of the domains corresponding to one of the bit states of the transistors 120. For example, the two population distributions 280a,b are shown in the embodiment of FIG. 6a, which correspond to the two bit states of a population of two-level transistors. At least one reference threshold voltage ($V_{TR}$) 290 divides the domains associated with the different bit states to evaluate the bit state of a particular transistor 120 according to whether the threshold voltage of that transistor 120 is above or below the reference threshold voltage 290. For example, the two domains shown in the embodiment of FIG. 6a are separated by the one reference threshold voltage 290. Within the domain of each bit state, the population of the transistors 120 may be spread in an approximately normal distribution as a function of effective threshold voltage $V_T$, such as in the embodiment of FIG. 6a.

Low and high safety threshold voltages 300, 310 may be selected to separate the domains of the population distributions 280a,b to reduce the likelihood of inaccurate evaluation of the bit states of the transistors 120. The low safety threshold voltage ($V_{SL}$) 300 is selected to be below the reference threshold voltage 290, whereas the high safety threshold voltage ($V_{SH}$) 310 is selected to be above the reference threshold voltage 290. The low and high safety threshold voltages 300, 310 provide a safety buffer 320 between the population distributions 280a,b to improve the discernibility of the bit states of the transistors 120. For example, the safety buffer 320 can serve as a margin that permits accurate reading of the bit states even if the memory element 160 loses or gains some charge over time. The program and erase operations set the effective threshold voltages $V_T$ of each of the transistors 120 to have a value below the low safety threshold voltage 300 or above the high safety threshold voltage 310. When the bit sensor 210 compares the sense voltage on the first capacitor 240a to the comparator reference voltage $V_{Cref}$ 270, as described above in reference to FIGS. 4 and 5, a transistor 120 having an effective threshold voltage $V_T$ that is approximately equal to the high safety threshold voltage 310, as shown in FIG. 6a, would produce a sense voltage that is approximately equal to the low comparator threshold voltage 250, as shown in FIG. 5. Similarly, an effective threshold voltage $V_T$ that is approximately equal to the low safety threshold voltage 300, as shown in FIG. 6a, would produce a sense voltage that is approximately equal to the high comparator threshold voltage 260, as shown in FIG. 5.

FIG. 6b is a graph showing a plot of shifted distributions 330a,b that respectively correspond to the population distributions 280a,b of FIG. 6a. Since the bit sensor 210 evaluates a read current $I_{READ}$ that substantially differs from the cell current $I_{CELL}$ because of the leakage current $I_L$, the bit sensor 210 inaccurately evaluates the population distributions 280a,b as shifted distributions 330a,b. The shifted distributions 330a,b are shifted from the actual population distributions 280a,b in the dimension of effective threshold voltage $V_T$, this shift being referred to as "margin loss." There is at least one high-risk region 340 that is shifted below the high safety threshold voltage 310 and into the safety buffer 320. There is an increased probability that the bit states of the transistors 120 that populate the high-risk region 340 will be incorrectly evaluated by the bit sensor 210. For example, if the bit sensor 210 evaluates a transistor 120 as having an effective threshold voltage $V_T$ at approximately the high safety threshold voltage 310, the corresponding sense voltage is less than the low comparator threshold voltage 250. However, if the bit sensor 210 evaluates a transistor 120 as having an effective threshold voltage $V_T$ in the high-risk region 340 below the high safety threshold voltage 310, the corresponding sense voltage may be approximately equal to the low comparator threshold voltage 250. Thus, the bit sensor 210 may erroneously evaluate the bit state of the transistor having the effective threshold voltage $V_T$ in the high-risk region 340.

The problem of the leakage current $I_L$ detrimentally affecting the accuracy with which the bit sensor 210 evaluates the bit state may be even more acute for multi-level transistors than for two-level transistors. For example, the population distributions of the transistors 120 may have steeper sides and smaller safety buffers for multi-level transistors than for two-level transistors.

Figure 7:
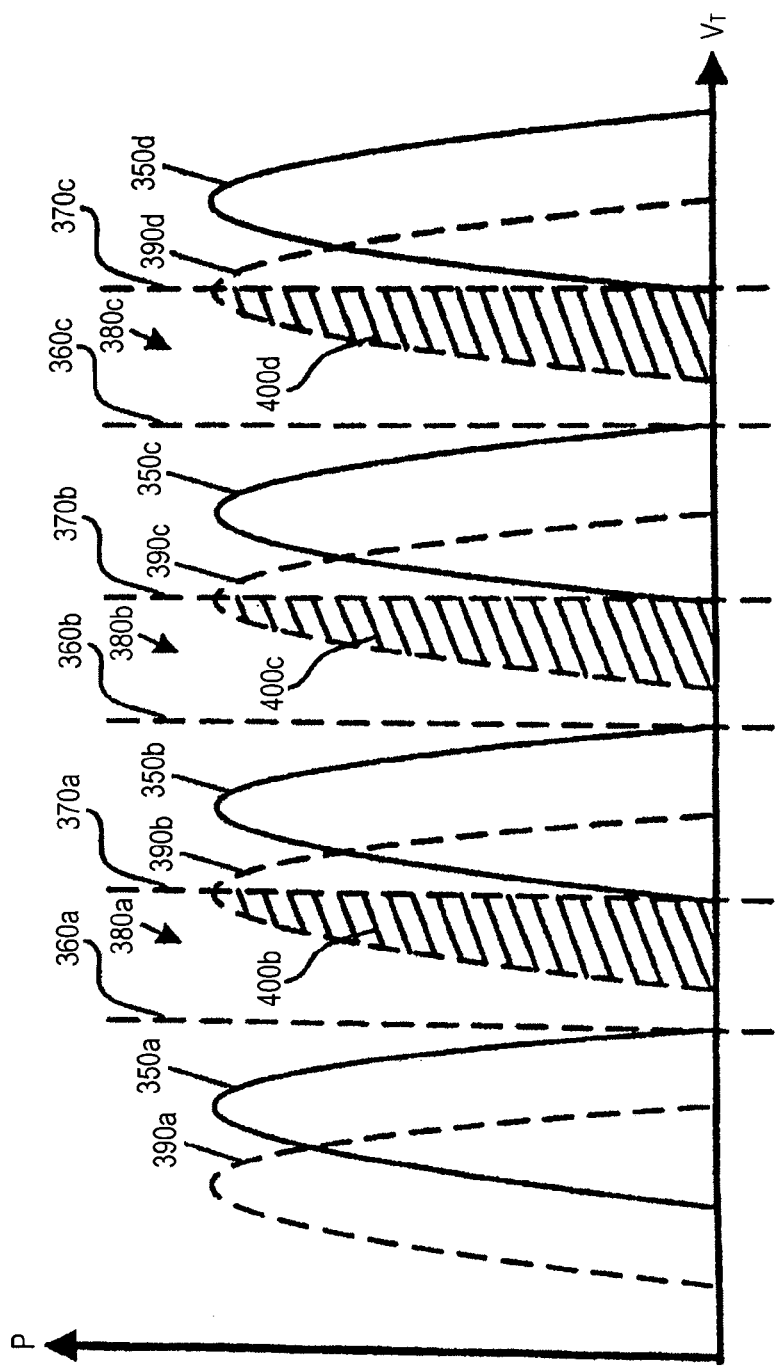
FIG. 7 is a graph showing a plot of distributions of population (P) for a plurality of two-level transistors as a function of effective threshold voltage ($V_T$), and shifted population distributions caused by leakage current from the selected transistor to the neighboring transistor.

FIG. 7 is a graph showing a plot of four population distributions 350a-350d for an exemplary embodiment of four-level, single-bit transistors. Each one of the four population distributions 350a-350d contains a set of transistors storing a single bit state chosen from among the four alternative bit states. For example, each of the four alternative bit states may correspond to two binary digits of data: "00", "01", "10", or "11", respectively. Typically, the population distributions 350a-350d are more narrowly concentrated for such multi-level transistors than two-level transistors. Low safety threshold voltages 360a-360c and high safety threshold voltages 370a-370c are defined to provide a plurality of safety buffers 380a-380c therebetween. However, because of the relative proximity of the population distributions 350a-350d, the safety buffers 380a-380c are smaller than for the two-level transistors of FIGS. 6a and 6b. The leakage current $I_L$ causes an effective shift in the population distributions 350a-350d to shifted distributions 390a-390d as measured by the bit sensor 210, the amount of the shift being a function of the amount of the leakage current $I_L$. Portions of at least three of the population distributions 350b-350d cross the high safety threshold voltages 370a-370c, intruding into the safety buffers 380a-380c and becoming high-risk regions 400b-400d, as shown in FIG. 7. Thus, a larger portion of the transistor population distributions 350a-350d are high-risk regions 400b-400d, resulting in a higher rate of reading error.

As shown in FIG. 2, the NVM package 100 comprises a shielding voltage applicator 410 adapted to apply a shielding voltage to the input terminal 140 or the output terminal 150 of at least one of the transistors 120c-120g that is downstream of the selected transistor 120b to suppress the problematic leakage current $I_L$ in the neighboring transistor 120c. For example, the shielding voltage applicator 410 may be adapted to apply a voltage of from about 0.1 to about 0.5 V. In one embodiment, the shielding voltage is applied to the output terminal 150 of the transistor 120c adjacent to, and downstream of, the selected transistor 120b. The shielding voltage applicator 410 can be coupled to one of the bitlines 190d-190h that are coupled to the downstream transistors 120c-120g to apply the shielding voltage to one of the downstream transistors 120c-120g. The shielding voltage applied to one of the downstream bitlines 190d-190h increases the voltage at the output terminal 150 of the neighboring transistor 120c to decrease the amount of leakage current $I_L$ into the neighboring transistor 120c, thereby directing more of the cell current $I_{CELL}$ into the bit sensor 210.

In one version, the shielding voltage applicator 410 is a shielding voltage supply 420 that is adapted to couple a preselected shielding voltage to the input terminal 140 or the output terminal 150 of at least one of the transistors 120c-120g that is downstream of the selected transistor 120b. For example, as shown in FIG. 2, the shielding voltage supply 420 may be coupled to the bitline 190f downstream from the selected transistor 120b to substantially suppress the current leakage into the transistors 120c-120g.

Figure 8:
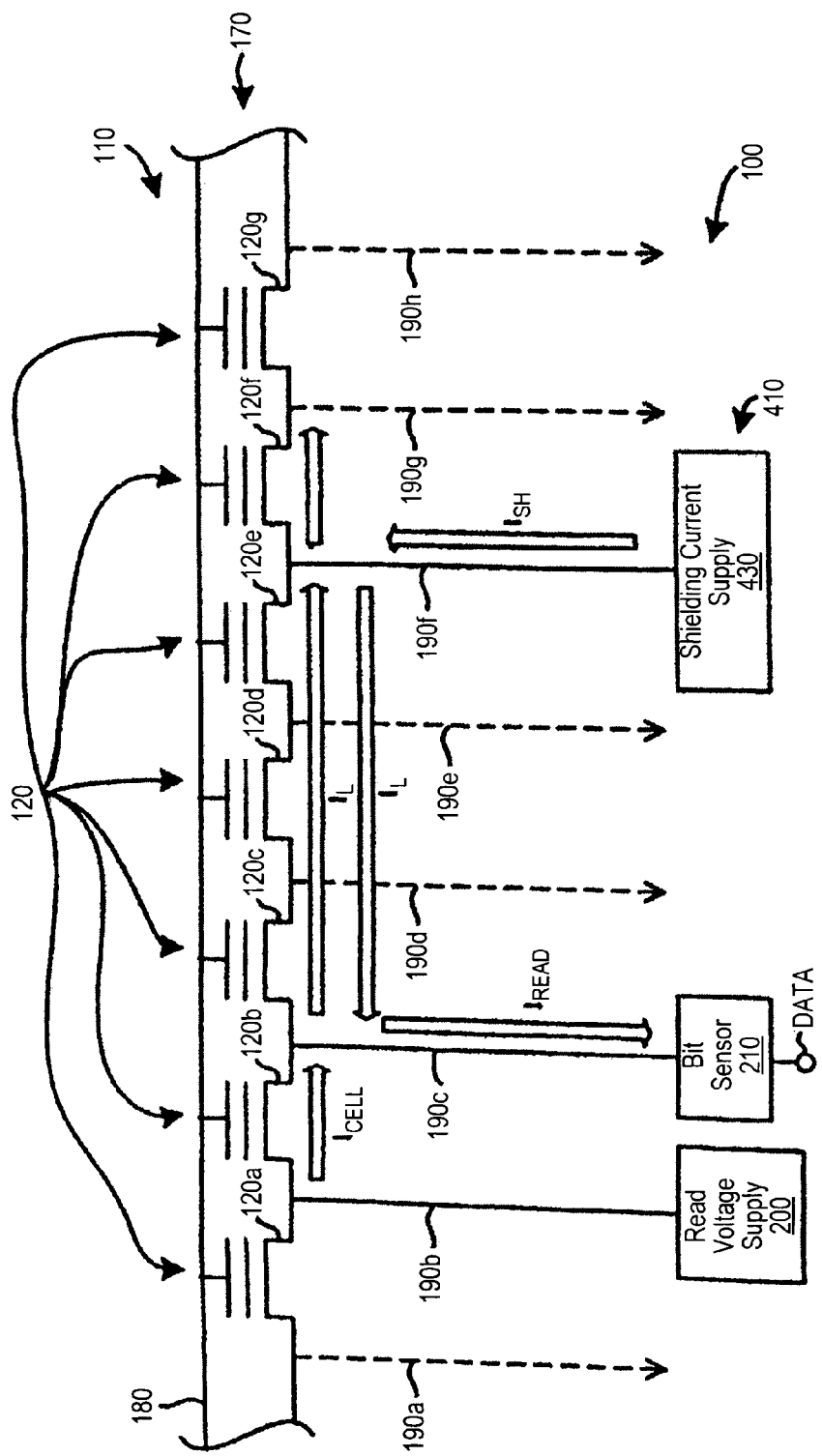
FIG. 8 is a non-volatile memory package having a non-volatile memory array that is configured as a virtual ground array coupled to a shielding voltage applicator comprising an embodiment of a shielding current supply.

In another version, an exemplary embodiment of which is illustrated in FIG. 8, the shielding voltage applicator 410 comprises at least one shielding current supply 430 that is adapted to supply at least one preselected shielding current $I_{SH}$ to one of the bitlines 190d-190h downstream of the selected transistor 120b. The shielding current $I_{SH}$ reduces the voltage difference between the bitline connected to the source of the selected transistor 120b, such as bitline 190c, and the bitline to which the shielding current $I_{SH}$ is applied, such as bitline 190f, thereby reducing the leakage current $I_L$. For example, the shielding current supply 430 may be adapted to supply the shielding current $I_{SH}$ to have a magnitude substantially the same as the reference current $I_{REF}$ that is used by the bit sensor 210. This shielding current $I_{SH}$ may sufficiently reduce the leakage current $I_L$ to yield a reliable read current $I_{READ}$.

Figure 9:
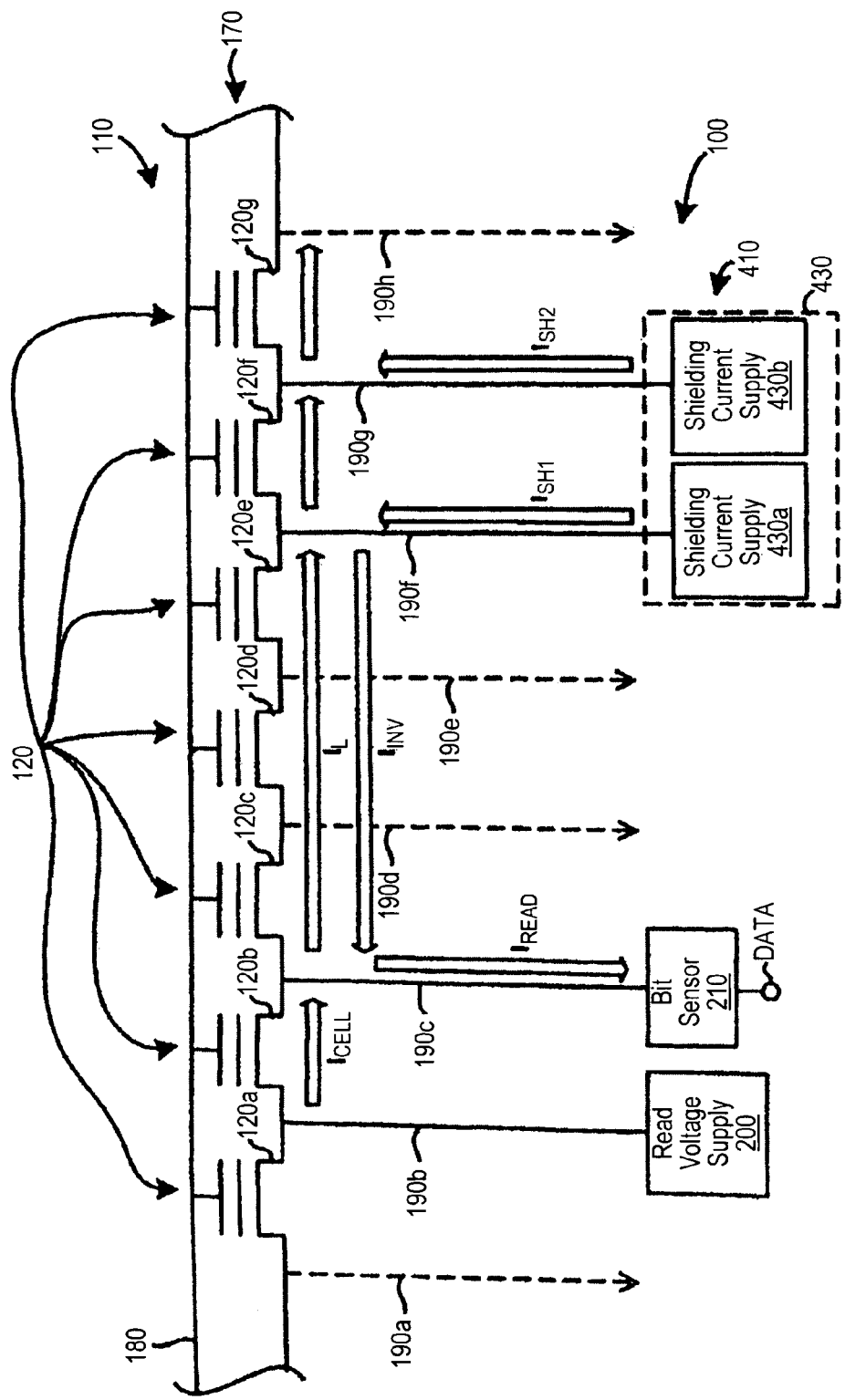
FIG. 9 is a non-volatile memory package having a non-volatile memory array that is configured as a virtual ground array coupled to a shielding voltage applicator comprising another embodiment of a shielding current supply.

In another embodiment, as illustrated in the example of FIG. 9, the shielding current supply 430 comprises a first shielding current supply 430a adapted to supply a first shielding current $I_{SH1}$ to the input terminal 140 or the output terminal 150 of a first one of downstream transistors 120c-120f. The shielding current supply 430 also comprises a second shielding current supply 430b adapted to supply a second shielding current $I_{SH2}$ to the input terminal 140 or the output terminal 150 of a second one of downstream transistors 120d-120g that is downstream of the first one of downstream transistors 120c-120f, to further suppress the leakage current $I_L$. For example, for a first downstream transistor 120e, the second shielding current $I_{SH2}$ may be supplied to the input terminal 140 or the output terminal 150 of an adjacent downstream transistor 120f. The first and second shielding currents $I_{SH1}$, $I_{SH2}$ may have substantially the same magnitude, or alternatively these currents may have different magnitudes. For example, at least one of the first and second shielding currents may have substantially the same magnitude as the reference current $I_{REF}$ that is used by the bit sensor 210.

The shielding voltage applicator 410 may be adapted to apply a shielding voltage to the downstream transistors 120c-120g that is selected to improve the reading accuracy by producing a desirable average of the read current $I_{READ}$ over the preselected time period during which the first capacitor 240a is charged. After the preselected time period has elapsed, the comparator 220 compares the sense voltage to the comparator reference voltage $V_{Cref}$ and outputs a voltage having a value that corresponds to the data stored on the selected transistor 120b.

Figure 10A:
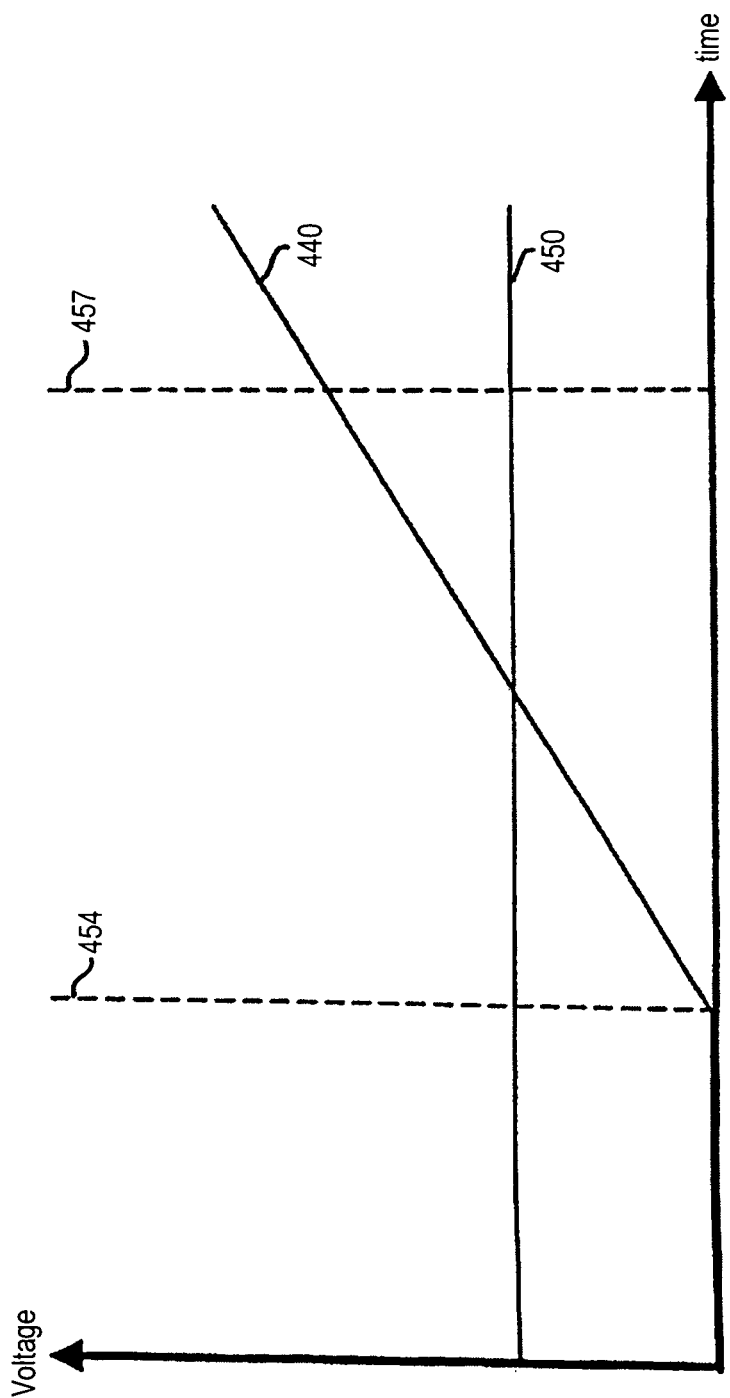
FIG. 10a is a graph showing superimposed plots, as functions of time over a preselected time period, of an increasing voltage on a capacitor being charged by a cell current induced through a selected transistor and a shielding voltage on a downstream transistor.

In one embodiment, the shielding voltage applied to the downstream transistors 120c-120g is a function that is adapted to result in a read current $I_{READ}$ that, when averaged over the preselected period of time during which the selected transistor 120b is being read, is approximately equal to $I_{CELL}$. FIG. 10a is a graph showing plots, as a function of time, of an exemplary embodiment of the sense voltage, shown as a voltage 440, on the first capacitor 240a of FIG. 4 and a shielding voltage, shown as a voltage 450, applied by the shielding voltage applicator 410 to one of the downstream transistors 120c-120g of FIG. 2. The preselected time period begins at a start time 454 and ends at a stop time 457. The magnitude of the shielding voltage 450 is selected to be from about 90% to about 110% of an average of the sense voltage 440 over the preselected time period during which the bit sensor 210 performs current-to-voltage conversion, namely from the start time 454 to the stop time 457. The shielding voltage 450 is held at this substantially constant value during the preselected time period, as shown by the plot of the shielding voltage 450 in FIG. 10a. Prior to reading the selected transistor 120b, the bitlines 190b,190c coupled to the selected transistor 120b are discharged to ground. Once the read operation begins at the start time 454, the read voltage is applied to the bitline 190b. As a result, the voltage 440 on the first capacitor 240a starts at a low value, such as about 0 V, and increases approximately linearly as the read current $I_{READ}$ passes from the output terminal 150 of the selected transistor 120b to the first capacitor 240a to charge the first capacitor 240a. At the stop time 457, the sense voltage 440 on the first capacitor 240a is evaluated to determine the bit state of the selected transistor 120b.

Figure 10B:
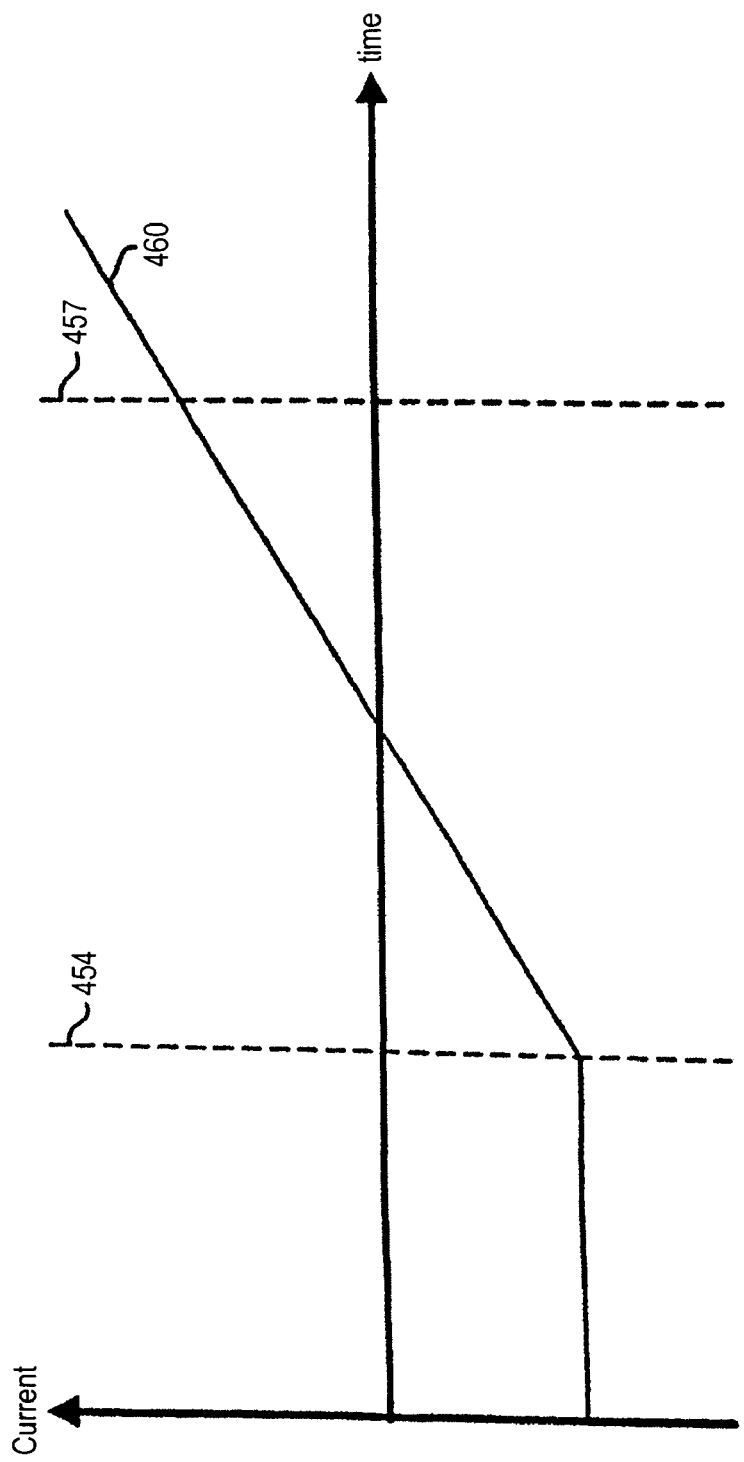
FIG. 10b is a graph showing a plot, as a function of time over the preselected time period of FIG. 10a, of a leakage current $I_L$ through a downstream transistor.

FIG. 10b is a graph showing a plot, as a function of time, of the leakage current $I_L$, shown as a current 460, resulting from the application of the shielding voltage 450 of FIG. 10a to one of the downstream transistors 120c-120g of FIG. 2. During a first portion of the preselected time period beginning at the start time 454, the sense voltage 440 on the first capacitor 240a is less than the shielding voltage 450. The polarity of the voltage difference between the sense voltage 440 and the shielding voltage 450 results in an inversion of the leakage current $I_L$ 460, as shown in FIGS. 2, 8, 9, and 10b, passing upstream from the downstream transistors 120c-120g to the bitline 190c that is coupled to the output terminal 150 of the selected transistor 120b. During a second portion of the preselected time period, beginning after the intersection of the shielding voltage 450 and the sense voltage 440, shown in FIG. 10a, the sense voltage 440 is greater than the shielding voltage 450. The reversed polarity of this voltage difference between the sense voltage 440 and the shielding voltage 450 results in the leakage current $I_L$ 460, having a magnitude corresponding to the voltage difference, that passes downstream from the output terminal 150 of the selected transistor 120b to the downstream transistors 120c-120g.

The NVM package 100 is capable of accurately and reliably reading stored data from the NVM array 110. By suppressing current leakage into the neighboring transistors 120c-120g of the selected row 170, the bit state of the selected transistor 120b can be more accurately and reliably evaluated. For example, the safety buffers between the low threshold safety voltages $V_{TL}$ and the high threshold safety voltages $V_{TH}$ can be widened, permitting larger contrasts between the effective threshold voltages $V_T$ associated with the different bit states.

Although embodiments consistent with the present invention have been described in considerable detail with regard to embodiments thereof, other versions are possible. For example, the transistors 120 may comprise other electronic structures equivalent in function to the illustrative structures herein. Furthermore, relative or positional terms, such as "first" or "second," are used with respect to the exemplary embodiments and are interchangeable. Therefore, the appended claims should not be limited to the description of the versions contained herein.

What is claimed is:

1. A non-volatile memory device comprising:
   a non-volatile memory array comprising a plurality of memory cells electrically coupled in series, each of the memory cells having a first terminal and a second terminal such that the second terminal of a selected memory cell is coupled to the first terminal of a next memory cell;
   a read circuit to supply a voltage to the first terminal of the selected memory cell, to induce a cell current between the first terminal and the second terminal of the selected memory cell;
   a bit sensor to receive a read current from the second terminal of the selected memory cell;
   a first shielding voltage applicator adapted to apply a first voltage to one of the first terminal and the second terminal of a first downstream memory cell; and
   a second shielding voltage applicator adapted to apply a second voltage to one of the first terminal and the second terminal of a second downstream memory cell further away from the selected memory cell.

2. A non-volatile memory device according to claim 1, wherein at least one of the shielding voltage applicators comprises a shielding voltage supply adapted to couple a preselected voltage to the first terminal and the second terminal of the first or second downstream memory cell.

3. A non-volatile memory device according to claim 1, wherein at least one of the shielding voltage applicators comprises a shielding current supply adapted to supply a preselected current to the first terminal and the second terminal of the first or second downstream memory cell.

4. A non-volatile memory device according to claim 1, wherein at least one of the shielding voltage applicators is adapted to apply a voltage of from about 0.1 to about 0.5 Volts.

5. A non-volatile memory device according to claim 1, wherein the bit sensor is adapted to perform current-to-voltage conversion of the read current from the second terminal of the selected memory cell to a sense voltage over a pre-selected time period, and wherein at least one of the shielding voltage applicators is adapted to apply a voltage of a magnitude selected to be from about 90% to about 110% of an average of the sense voltage over the pre-selected time period.

6. A non-volatile memory device according to claim 1, wherein the non-volatile memory array comprises a virtual ground array.

7. A non-volatile memory device according to claim 1, wherein the non-volatile memory device is formed as a thin small-outline package (TSOP) or chip scale package (CSP).

8. A non-volatile memory device according to claim 1, wherein the memory cells comprise n-channel metal-oxide-semiconductor field effect transistor (NMOS FET) memory cells, the first terminal is a drain of the NMOS FET, and the second terminal is a source of the NMOS FET.

9. A non-volatile memory device according to claim 1, wherein the memory cells comprise Flash memory cells.

10. A method of compensating leakage reading current of a non-volatile memory array, the non-volatile memory array comprising a plurality of memory cells that are electrically coupled in series, each of the memory cells having a first terminal and a second terminal such that the second terminal of one of the memory cells is coupled to the first terminal of a next memory cell in a downstream direction, the method comprising:
   (a) supplying a read voltage to the first terminal of a selected memory cell of the plurality of memory cells, to induce a cell current between the first terminal and the second terminal of the selected memory cell;

(b) receiving and evaluating a read current from the second terminal of the selected memory cell; and (c) applying at least two voltages to the first terminal or the second terminal of at least two downstream memory cells of the plurality of memory cells, the at least two downstream memory cells being in the downstream direction from the selected memory cell.

11. A method according to claim 10, wherein (c) comprises generating a substantially constant voltage and supplying the substantially constant voltage to the first terminal or the second terminal of at least one of the at least two downstream memory cells.

12. A method according to claim 10, wherein (c) comprises generating a current and supplying the current to the first terminal or the second terminal of the downstream memory cell.

13. A method according to claim 10, wherein (c) comprises generating first and second currents, supplying the first current to the first terminal or the second terminal of the downstream memory cell as a first downstream memory cell, and supplying the second current to the first terminal or the second terminal of a second downstream memory cell that is downstream of the first downstream memory cell.

14. A method according to claim 10, wherein (c) comprises applying a voltage of from about 0.1 to about 0.5 Volts.

15. A method according to claim 10, wherein (a) comprises supplying a voltage of from about 0.8 to about 2.5 Volts.

16. A method according to claim 10, wherein (b) comprises performing current-to-voltage conversion of the read current from the second terminal of the selected memory cell to a sense voltage over a pre-selected time period, and wherein (c) comprises applying a shielding voltage of a magnitude selected to be from about 90% to about 110% of an average of the sense voltage over the pre-selected time period.

17. A method according to claim 10, wherein the non-volatile memory array comprises a virtual ground array.

18. A method according to claim 10, wherein the memory cells comprise n-channel metal-oxide-semiconductor field effect transistor (NMOS FET) memory cells, (a) comprises supplying the first voltage to the drain of the selected memory cell, and (b) comprises evaluating a current from the source of the selected memory cell.

19. A method according to claim 10, wherein the memory cells comprise Flash memory cells.

20. A non-volatile memory device according to claim 9, wherein the memory cells comprise Flash multi-bits memory cells.

21. A method according to claim 19, wherein the memory cells comprise Flash multi-bits memory cells.

* * * * *